United States Patent
Yamaguchi

[11] Patent Number: 5,155,574
[45] Date of Patent: Oct. 13, 1992

[54] SEMICONDUCTOR DEVICE
[75] Inventor: Hiroshi Yamaguchi, Fukuoka, Japan
[73] Assignee: Mitsubishi Denki Kabushiki Kaisha, Tokyo, Japan
[21] Appl. No.: 663,433
[22] Filed: Mar. 1, 1991
[30] Foreign Application Priority Data
 Mar. 20, 1990 [JP] Japan .................. 2-71366
[51] Int. Cl.⁵ .......................... H01L 29/40
[52] U.S. Cl. .................. 357/53; 357/23.8; 357/23.4
[58] Field of Search .......... 357/23.4, 23.8, 53
[56] References Cited
 U.S. PATENT DOCUMENTS
 4,574,209 3/1986 Lade et al. ............. 357/23.8
 4,901,127 2/1990 Chow et al. ............ 357/23.8
 FOREIGN PATENT DOCUMENTS
 5986260 11/1982 Japan .
 0252480 10/1988 Japan .
 0310171 12/1988 Japan .

Primary Examiner—Georgia Y. Epps
Attorney, Agent, or Firm—Oblon, Spivak, McClelland, Maier & Neustadt

[57] ABSTRACT

A discrete array (30) of p-type regions (31) surrounding channel regions of n-channel MOSFET cells is provided in a drain region of the MOSFET cells. The p-type regions have depth corresponding to the depth of p-type areas (5) defining the channels. A depletion layer (F1) which is generated and extends from the channel regions through application of a voltage is stretched by the p-type regions, so that the electric field in the depletion layer is weakened. As a result, anti-breakdown ability of the MOSFET cells is improved. The discrete arrangement of the p-type regions is required in order to obtain current path between the channels and n-type drain regions (4).

17 Claims, 14 Drawing Sheets

5,155,574

SEMICONDUCTOR DEVICE

BACKGROUND OF THE INVENTION

1. Field of the Invention

The present invention relates to a field effect semiconductor device and a manufacturing method thereof and more particularly to an improvement for increasing anti-breakdown ability thereof.

2. Description of Prior Arts

FIG. 10A is a plan view schematically showing the surface part of a conventional n-channel power MOSFET (Metal Oxide Semiconductor Field Effect Transistor) 100, and FIG. 10B is a cross-sectional view taken along the line B1—B1 of FIG. 10A. FIG. 10A corresponds to a plan view taken on the plane B3—B3 of FIG. 10B.

The MOSFET 100 comprises $n^-$-type layers $3a$ and $3b$ formed on a p-type silicon substrate 1. An $n^+$-type buried layer 2 is provided between the substrate I and the $n^-$-type layer $3b$. The $n^-$-type layer $3b$ functions as an $n^-$-type drain layer. An $n^+$-type drain region 4 is formed between the $n^-$-type layers $3a$ and $3b$. As is apparent from FIG. 10A, the $n^+$-type drain region 4 surrounds the $n^-$-type layer $3b$, and the combination of the $n^+$-type drain region 4 and the $n^-$-type drain layer $3b$ forms the drain region of the MOSFET.

In the $n^-$-type layer $3b$, two p-type semiconductor regions 5 are formed. In each of the p-type semiconductor regions 5 is provided an $n^+$-type source region 6 having a hole in the center thereof. The portions of the p-type semiconductor regions 5 which surround the $n^+$-type source regions 6 are channel forming regions 9.

A gate insulating film 7 is formed so as to cover the surface of the $n^-$-type layer $3b$ and parts of the $n^+$-type source regions 6. A gate electrode 8 opposite to the channel forming regions 9 and peripheral regions thereof is formed on the gate insulating film 7 A source electrode 10 is provided so that the $n^+$-type source regions 6 and the p-type semiconductor regions 5 are short-circuited to each other. A layer insulating film 11 insulates the gate electrode 8 and the source electrode 10 electrically from each other. A drain electrode 12 is formed on the $n^+$-type drain region 4. A back electrode 13 connected to the ground level is formed on the bottom major surface of the semiconductor substrate I. As is clear from FIGS. 10A and 10B, the MOSFET 100 is an up drain type MOSFET comprising two MOS unit cells connected in parallel and being provided with the gate electrode 8 and the drain electrode 12 on the top surface side of the MOSFET or semiconductor element 100.

In the MOSFET having such structure, a gate voltage is applied between the gate electrode 8 and the source electrode 10 under the conditions that a drain voltage is applied between the drain electrode 12 and the source electrode 10. Thus, channels are formed in the channel forming regions 9, and current flows through these channels between the drain electrode 12 and the source electrode The magnitude of this current can be controlled by the magnitude of the gate voltage.

For such operations, it is necessary to keep the potential of the $n^+$-type source regions 6 and the potential of the center portions of the p-type semiconductor regions 5 equal at a same level. This is because the relation between the gate voltage and the channel current becomes indefinite when the p-type semiconductor regions 5 are at electrical floating levels from the $n^+$-type source regions 6. For satisfying such conditions, the source electrode 10 is formed so that the $n^+$-type source regions 6 and the center portions of the p-type semiconductor regions 5 are short-circuited to each other.

The output characteristics of the MOSFET 100 are shown in FIG. 11. When a source-drain voltage $V_D$ is lower than a breakdown voltage $V_{BD}$, a source-drain current $I_D$ increases as a function of a gate voltage $V_G$. When the source-drain voltage $V_D$ reaches the breakdown voltage $V_{BD}$, the MOSFET 100 is broken down instantaneously. Referring to FIG. 12 corresponding to a cross-sectional view taken along the line B2—B2 of FIG. 9A and FIG. 13 corresponding to a partially enlarged view thereof, this breakdown phenomenon in the MOSFET 100 is analized in detail hereinafter.

Considered is the case where the drain voltage $V_D$ applied between the source electrode 10 and the drain electrode 12 is increased in FIG. 12. When the drain voltage $V_D$ reaches the breakdown voltage $V_{BD}$ between the $n^-$-type drain layer $3b$ and the p-type semiconductor region 5, a breakdown current $J_C$ indicated by arrows flows from the $n^-$-type drain layer $3b$ to the source electrode 10.

An equivalent circuit of the MOS unit cells in such a state, as is shown in FIG. 13, comprises a reverse parallel connection between a parasitic npn transistor $T_r$ having a base resistor $R_a$ and a diode $D_a$. In the breakdown state, the breakdown current $J_C$ of FIG. 12 flowing into the bottom of the $n^+$-type source region 6 is directed through the base resistor $R_a$ of the transistor $T_r$ to the source electrode 10. The parasitic transistor $T_r$ is allowed to conduct, when the magnitude of the breakdown current $J_C$ satisfies the following formula (I):

$$J_C \times R_a > 0.6 [V] \quad (1)$$

where "0.6 [V]" is a built-in voltage of a pn-junction using silicon. The conduction of the parasitic transistor $T_r$ causes the respective MOS unit cells to be in a blocking state. As a result, the MOSFET 100 is broken down in a short time. For improving the anti-breakdown ability of this type of semiconductor device, it is necessary to prevent the product ($J_C \times R_a$) in the breakdown state from increasing.

However, in the conventional device structure, since the product ($J_C \times R_a$) exceeds 0.6 [V] as soon as the drain voltage reaches the breakdown voltage $V_{BD}$, the anti-breakdown ability thereof is not increased so much. This is a problem not only for the power MOSFETs but also for other field effect semiconductor devices such as IGBTs.

SUMMARY OF THE INVENTION

According to the present invention, a field effect semiconductor device comprises: (a) a first conductivity type semiconductor layer formed on a major surface of a second conductivity type semiconductor substrate; (b) a second conductivity type first semiconductor region formed selectively in a surface portion of the semiconductor layer; (c) a first conductivity type second semiconductor region formed selectively in a surface portion of the first semiconductor region; (d) an insulating film formed on a first area of an exposed surface of the first semiconductor region; (e) a control electrode formed on the insulating film; (f) a first main electrode formed to cover a second area of the exposed surface of the first semiconductor region and an exposed surface of the second semiconductor region, wherein the second area is separated from the first area across the exposed surface of the second semiconductor region; (g) a second main electrode formed on a predetermined position of an exposed surface of the semiconductor layer distant from the first semiconductor region; and (h) a second conductivity type semiconductor region group formed selectively in a portion of the semiconductor layer between the first semiconductor region and the second main electrode.

In a semiconductor device according to the present invention, a depletion layer extends from the first semiconductor region into the first conductivity type semiconductor layer by the voltage applied between the first and second main electrodes. Since the second conductivity type semiconductor region group is provided in the first conductivity type semiconductor layer, the extension of the depletion layer is spacially uniformed, and the magnitude of the breakdown current in the surface portion of the first conductivity type semiconductor layer can be reduced. As described in detail in the below preferred embodiments, the magnitude of the breakdown current in the surface portion of the first conductivity type semiconductor layer is a main factor of the breakdown voltage of the whole semiconductor device. Therefore, the decrease in the breakdown current improves anti-breakdown ability.

The above construction of the present invention is suitable for field effect unipolar device such as MOSFETs.

On the other hand, the present invention as applied to field effect bipolar device such as IGBTs comprises: (a) a first conductivity type semiconductor layer formed on a major surface of a second conductivity type semiconductor substrate; (b) a second conductivity type first semiconductor region formed selectively in a surface portion of the semiconductor layer; (c) a first conductivity type second semiconductor region formed selectively in a surface portion of the first semiconductor region; (d) an insulating film formed on a first area of an exposed surface of the first semiconductor region; (e) a control electrode formed on the insulating film; (f) a first main electrode formed to cover a second area of the exposed surface of the first semiconductor region and an exposed surface of the second semiconductor region, wherein the second area is separated from the first area across the exposed surface of the second semiconductor region; (g) a second conductivity type third semiconductor region formed in a surface portion of the semiconductor layer distant from the first semiconductor region; (h) a second main electrode formed on the third semiconductor region; and (i) a second conductivity type semiconductor region group formed selectively in a portion of the semiconductor layer between the first semiconductor region and the second main electrode.

The present invention is also directed to a manufacturing method of a field effect semiconductor device. According to the present invention, the method comprises the steps of; (a) forming a first conductivity type semiconductor layer on one major surface of a second conductivity type semiconductor substrate; (b) selectively introducing second conductivity type first impurities into the semiconductor layer to form a second conductivity type semiconductor region group surrounding a predetermined zone of the semiconductor layer in a plane substantially parallel to the one major surface; (c) forming a control electrode layer on the predetermined zone of the semiconductor layer, wherein the control electrode layer is electrically insulated by a first insulating film from the semiconductor layer and has a window., (d) introducing second conductivity type second impurities through the window into the semiconductor layer to form a second conductivity type first semiconductor region in the semiconductor layer, wherein the first semiconductor region faces to the window and a part of the control electrode layer; (e) selectively introducing first conductivity type third impurities through a part of the window into the first semiconductor region to form a first conductivity type second semiconductor region in the first semiconductor region; (f) forming a second insulating film covering the control electrode layer; and (g) forming a main electrode layer electrically in contact with each exposed surface of the first and second semiconductor regions through the window.

The "semiconductor region group" according to the present invention may include a plurality of discretely distributed regions, or may be composed of a plurality of regions connected to each other in the shape of a comb, for example.

Therefore, an object of the present invention is to improve anti-breakdown ability of a field effect semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Structure and Characteristics

Figure 1A:
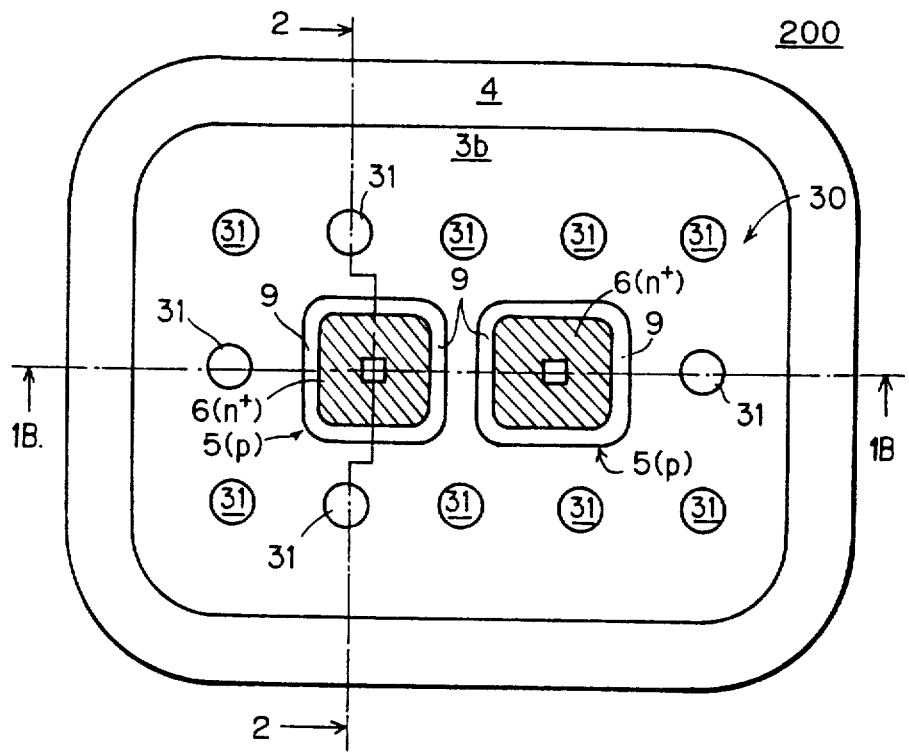
FIG. 1A is a plan view of a MOSFET according to a preferred embodiment of the present invention.
Figure 1B:
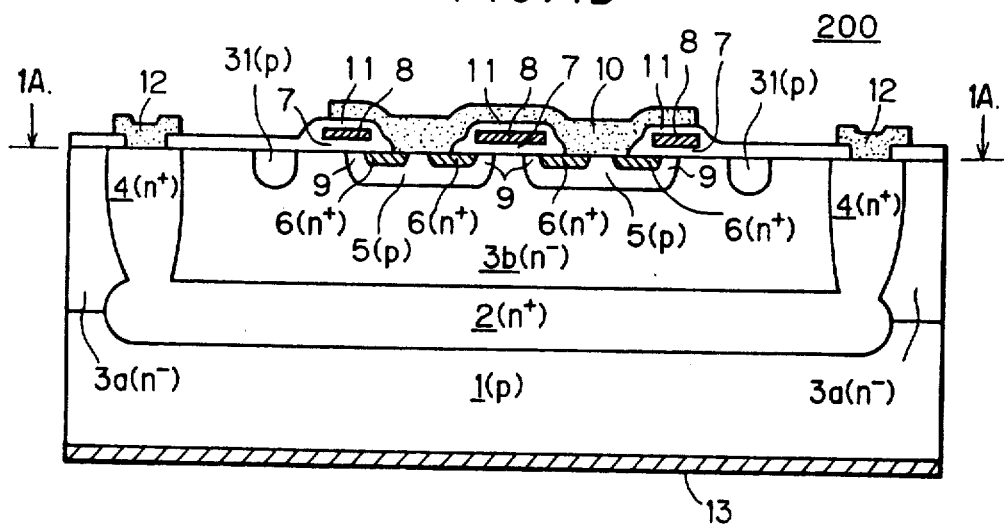
FIG. 1B is a cross-sectional view of the MOSFET taken along the line A1—A1 of FIG. 1A.

FIG. 1A is a schematic plan view of a power MOSFET 200 according to a preferred embodiment of the present invention, and FIG. 1B is a cross-sectional view taken along the line A1—A1 of FIG. 1A. FIG. 1A corresponds to a plan view taken on the plane A3—A3 of FIG. 1B.

Figure 10A:
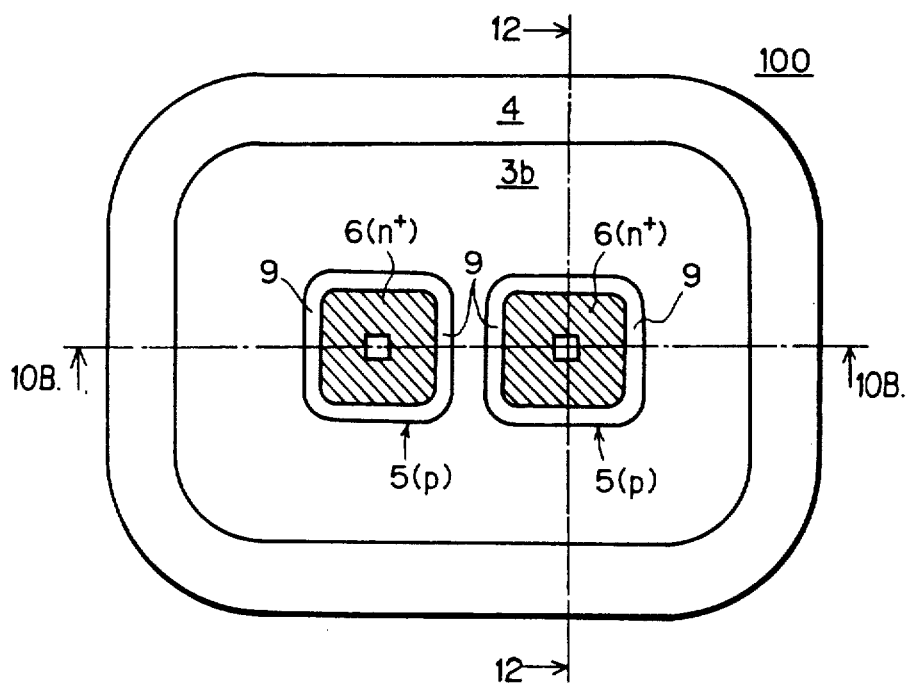
FIG. 10A is a plan view of a conventional MOSFET.
Figure 10B:
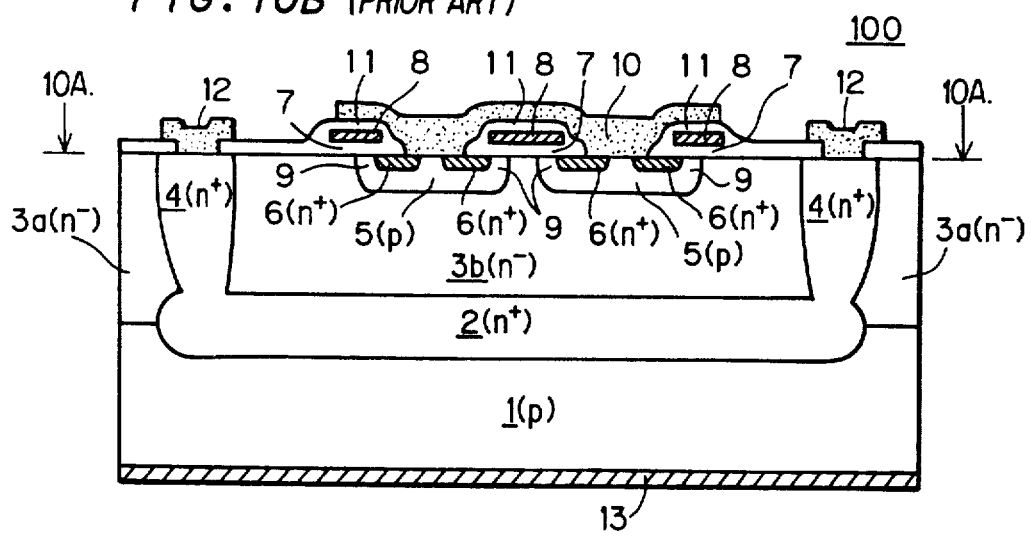
FIG. 10B is a cross-sectional view of the conventional MOSFET taken along the line B1—B1 of FIG. 10A.
Figure 11:
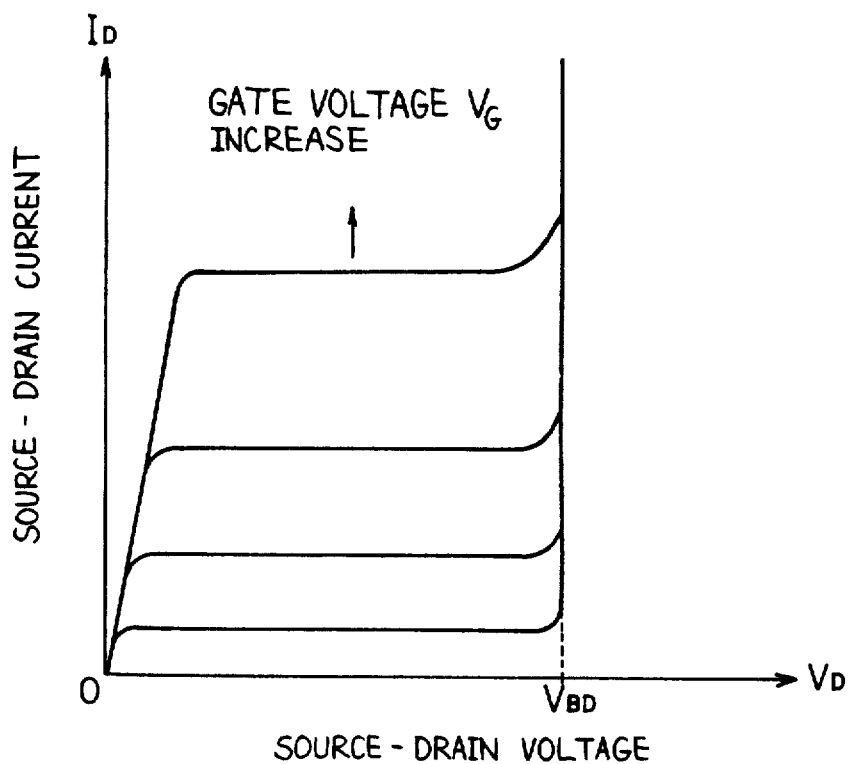
FIG. 11 shows characteristics of a MOSFET.

The same reference numerals are assigned to the same components as the MOSFET 100 shown in FIGS. 10A and 10B among respective components of the MOSFET 200. The characteristic structure of the MOSFET 200 according to this preferred embodiment is that a p-type semiconductor region group 30 composed of a plurality of p-type semiconductor regions 31 is formed in the top surface portion of an n⁻-type drain layer 3b. These p-type semiconductor regions 31 are spaced at approximately uniform intervals in a plane substantially parallel to the top major surface of a semiconductor substrate 1. The array of the p-type semiconductor regions 31 surrounds a pair of centered p-type semiconductor regions 5.

Corresponding to the approximately rectangular plane shape of the centered p-type semiconductor regions 5, the array of the p-type semiconductor regions 31 forms a rectangle. In the example shown in FIG. 1A, four p-type semiconductor regions 31 are disposed at the corners of the rectangular array, and eight p-type semiconductor regions 31 are disposed therebetween. Each of the p-type semiconductor regions 31 has a circular plan shape and has a bottom whose depth is substantially equal to the depth of the bottom of the p-type semiconductor regions 5.

Figure 2:
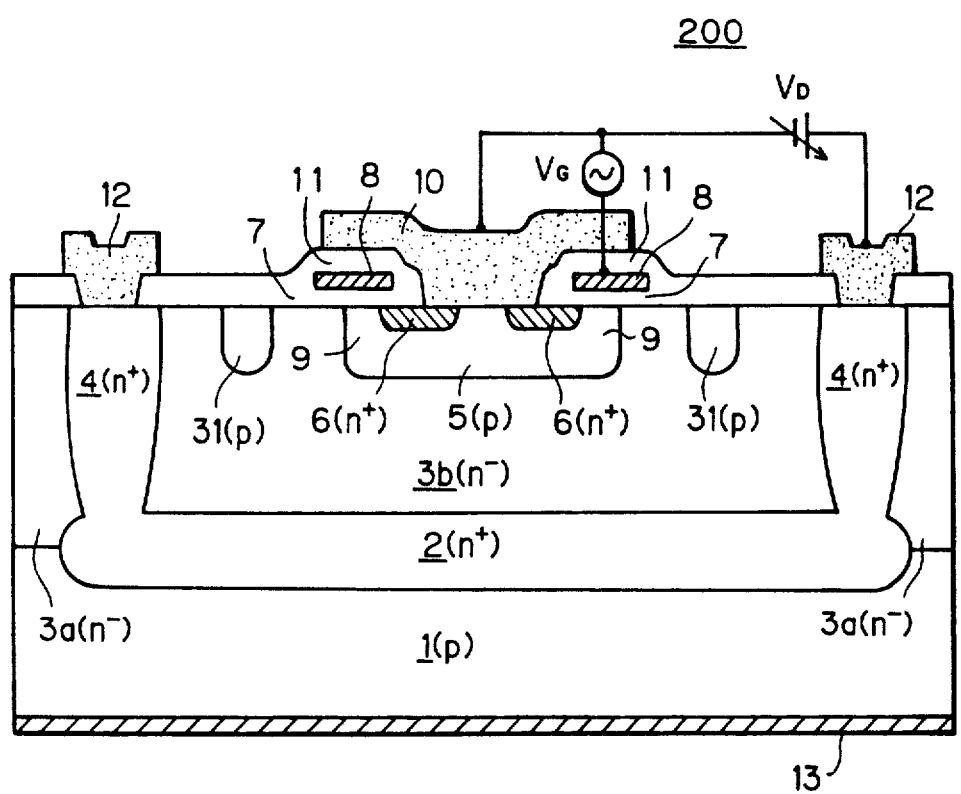
FIG. 2 is a cross-sectional view of the MOSFET taken along the line A2—A2 of FIG. 1A.

FIG. 2 is an enlarged cross-sectional view taken along the line A2—A2 of FIG. 1A. The MOSFET 200 is used in the same manner as the conventional MOSFET 100. That is, a gate voltage $V_G$ is applied between a source electrode 10 and a gate electrode 8 under the conditions that a drain voltage $V_D$ is applied between the source electrode 10 and a drain electrode 12. Thus channels are formed in channel forming regions 9 and current flows between an n⁺-type drain region 4 and n⁺-type source regions 6.

The p-type semiconductor regions 31 provided in the present invention contribute to an improvement in the anti-breakdown ability of the MOSFET 200. The reason is described hereinafter.

Figure 3A:
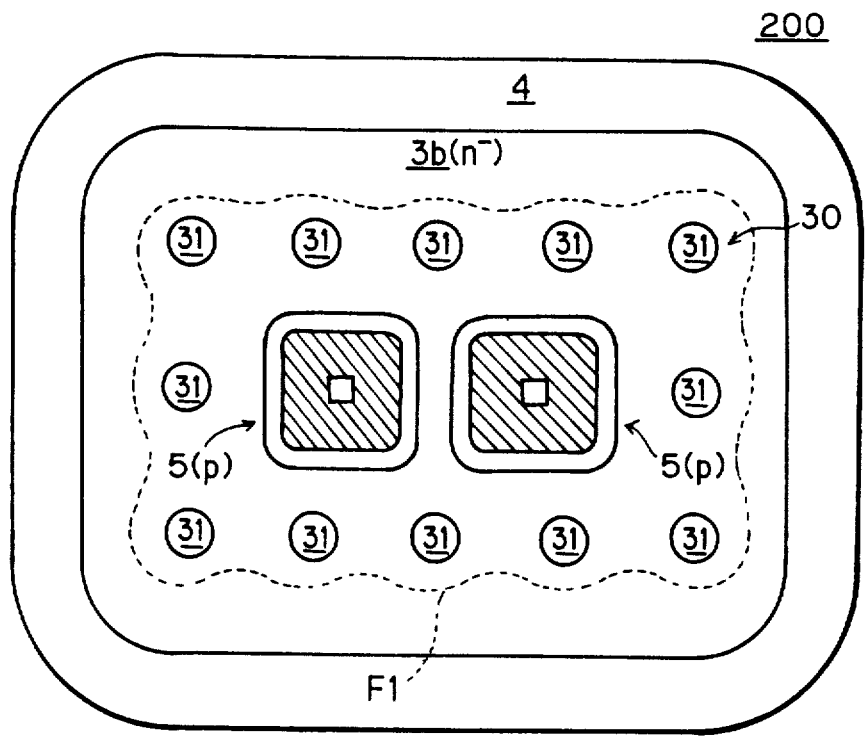
FIGS. 3A and 3B are explanatory views of the extension of a depletion layer in the preferred embodiment.
Figure 3B:
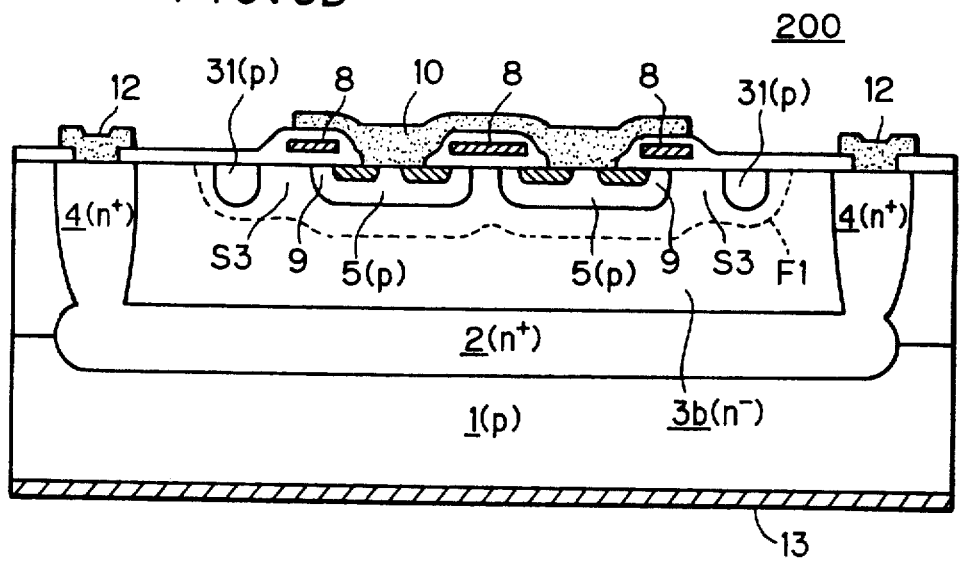
Figure 4A:
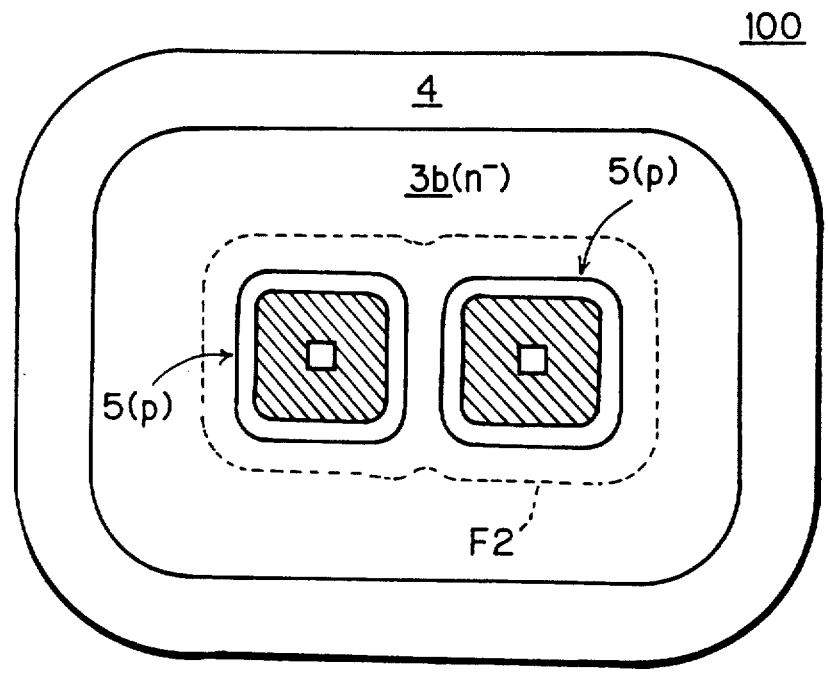
FIGS. 4A and 4B are explanatory views of the extension of a depletion layer in a conventional MOSFET.
Figure 4B:
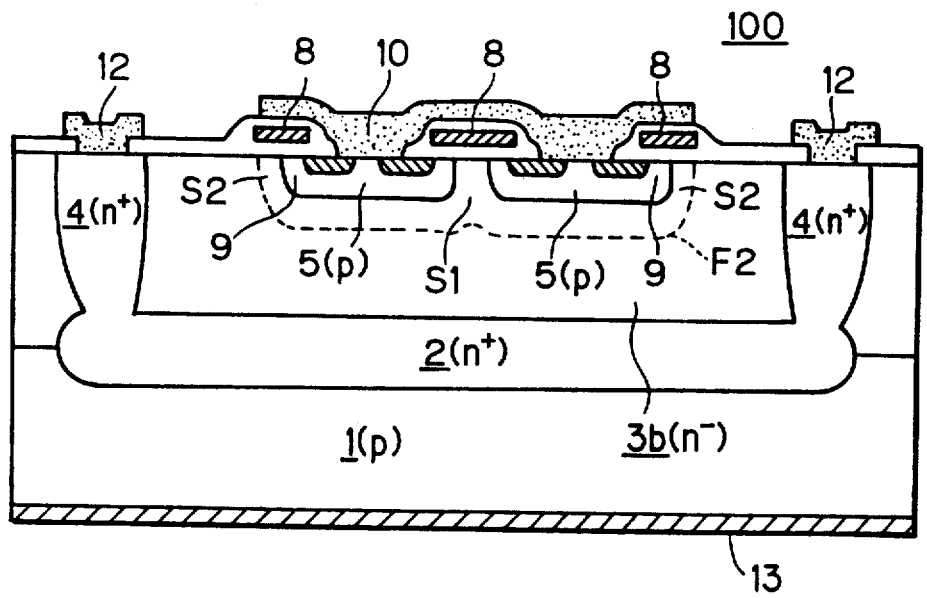
Figure 13:
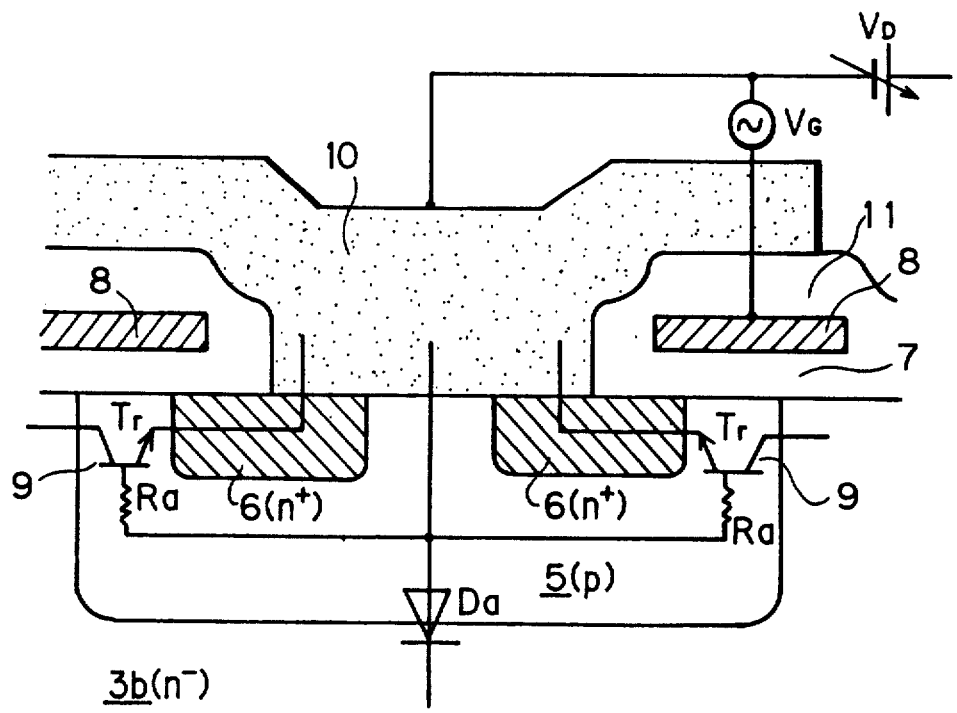
FIG. 13 shows a parasitic transistor in a MOSFET.
Figure 12:
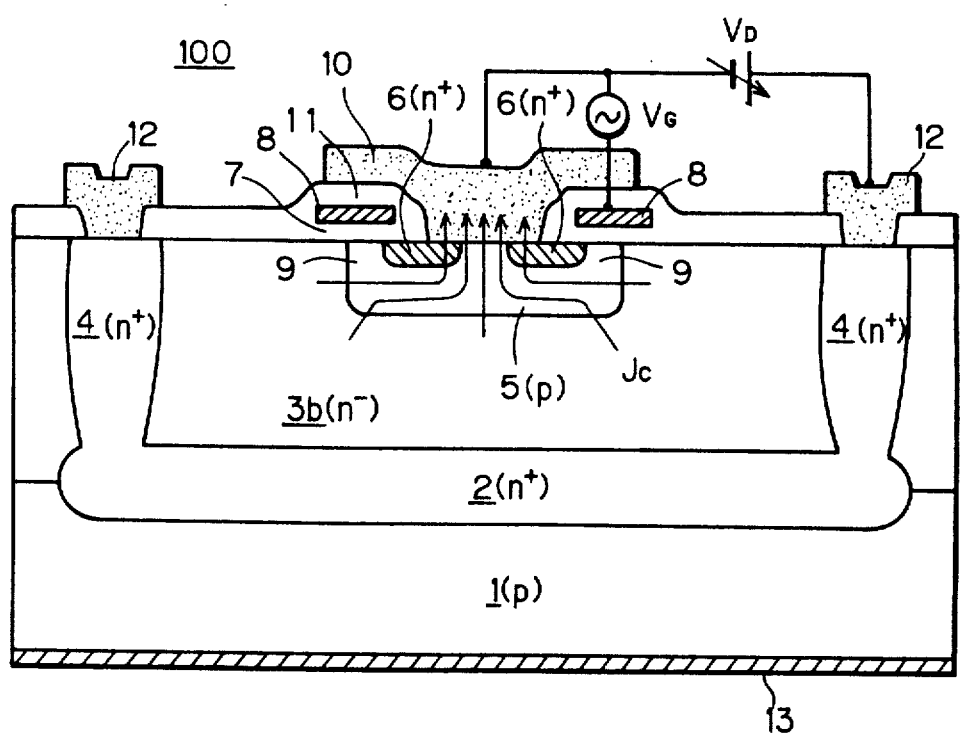
FIG. 12 shows a current path of a breakdown current in the conventional MOSFET.

FIGS. 3A and 3B show a breakdown state of the MOSFET 200 according to the preferred embodiment, and FIGS. 4A and 4B show a breakdown state of the conventional MOSFET 100. First, FIGS. 4A and 4B are referred to. When the MOSFET 100 is in the breakdown state by a relatively high voltage applied between the source electrode 10 and the drain electrode 12, a depletion layer F2 extends from the p-type semiconductor regions 5 to the inside of the n⁻-type layer 3b. However, the extension width of the depletion layer F2 is not uniform. In a section S1 between the two p-type semiconductor regions 5, since the respective depletion layers extending from the p-type semiconductor regions 5 overlap each other, the resulting depletion layer F2 is relatively wide. On the contrary, in a section S2 between the p-type semiconductor regions 5 and the n⁺-type drain region 4, since the aforesaid overlap is absent, the extension width of the depletion layer F2 is small. Accordingly an electric field strength in the section S2 is relatively large, and resultingly the breakdown current flowing through the section S2 into the parasitic transistor $T_r$ of FIG. 13 increases. It is because a current main path of the parasitic transistor is directed from the n⁺-type drain region 4 to the channel forming regions 9 that the section S2 is a matter of importance.

Next, FIGS. 3A and 3B are referred to. In the MOSFET 200, since the p-type semiconductor regions 31 are provided, a depletion layer F1 extends up to the peripheries of the p-type semiconductor regions 31. Accordingly electric field strength in a section S3 is reduced and breakdown current is decreased correspondingly. Even if the drain voltage reaches a breakdown voltage, the breakdown current is held relatively low and the value of $(J_C \times R_a)$ is also small, so that the parasitic transistor $T_r$ is not allowed to conduct. As a result, a blocking state is not generated as soon as the drain voltage reaches the breakdown voltage, and the anti-breakdown ability of the MOSFET 200 is improved.

The p-type semiconductor regions 31 are disposed in the current path between the n⁺-type drain region 4 and the channel forming regions 9. If it is assumed that a wall-like p-type continuous semiconductor region surrounding the p-type semiconductor regions 5 is provided, it prevents carriers in the current path from moving in the conduction state of the MOSFET 200. On the other hand, in the case where the discrete array of the p-type semiconductor regions 31 is formed according to the preferred embodiment, the current path is ensured through spaces between the regions 31 in the conduction state of the MOSFET 200, thereby a normal operation of the MOSFET 200 being maintained. This is the reason why the p-type semiconductor regions 31 are formed selectively or partially.

B. Manufacturing Processes

Figure 5A:
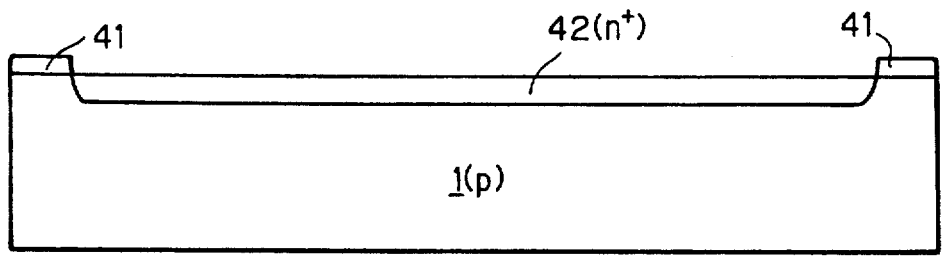
FIGS. 5A to 5H shows manufacturing processes of the MOSFET according to the preferred embodiment.
Figure 5B:
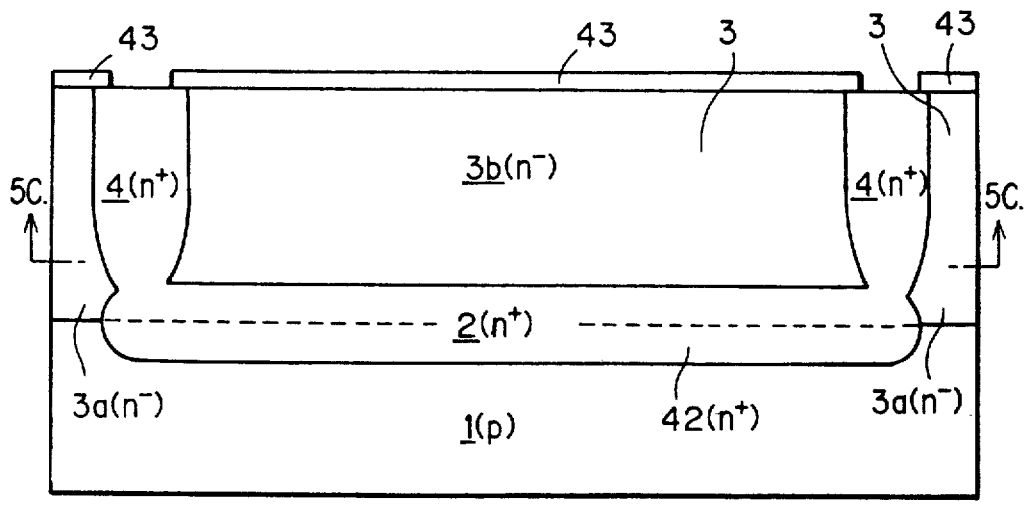
Figure 5C:
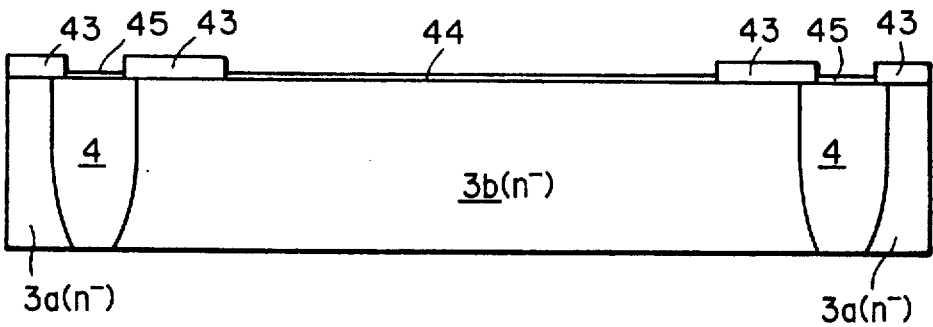
Figure 5D:
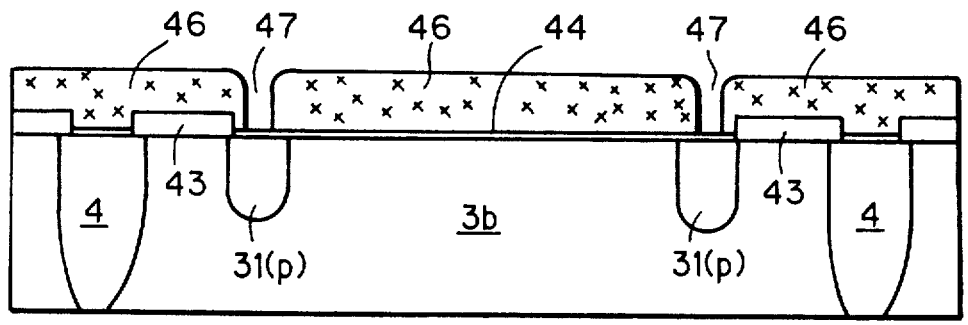
Figure 5E:
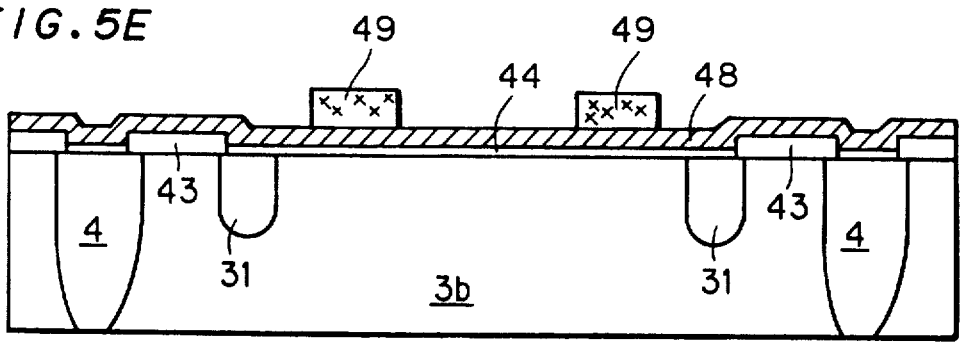
Figure 5F:
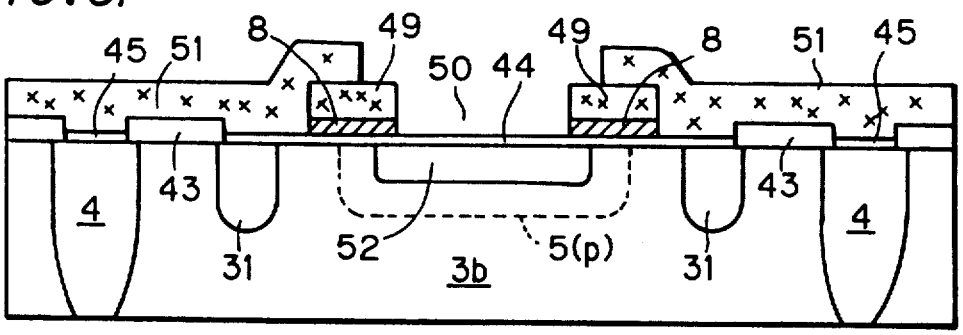
Figure 5G:
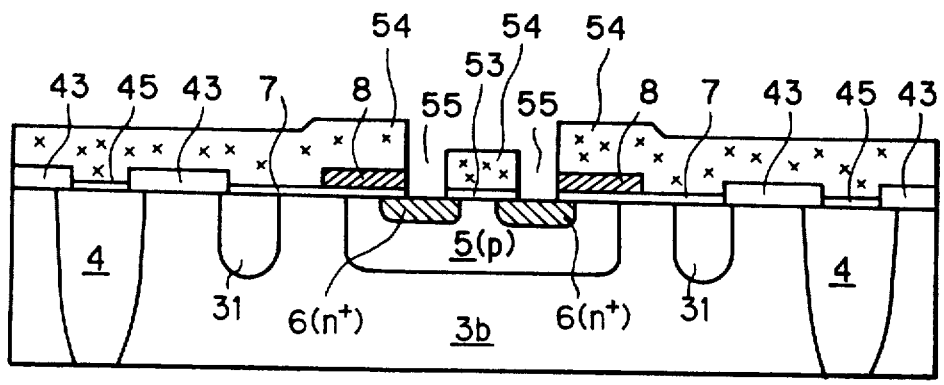
Figure 5H:
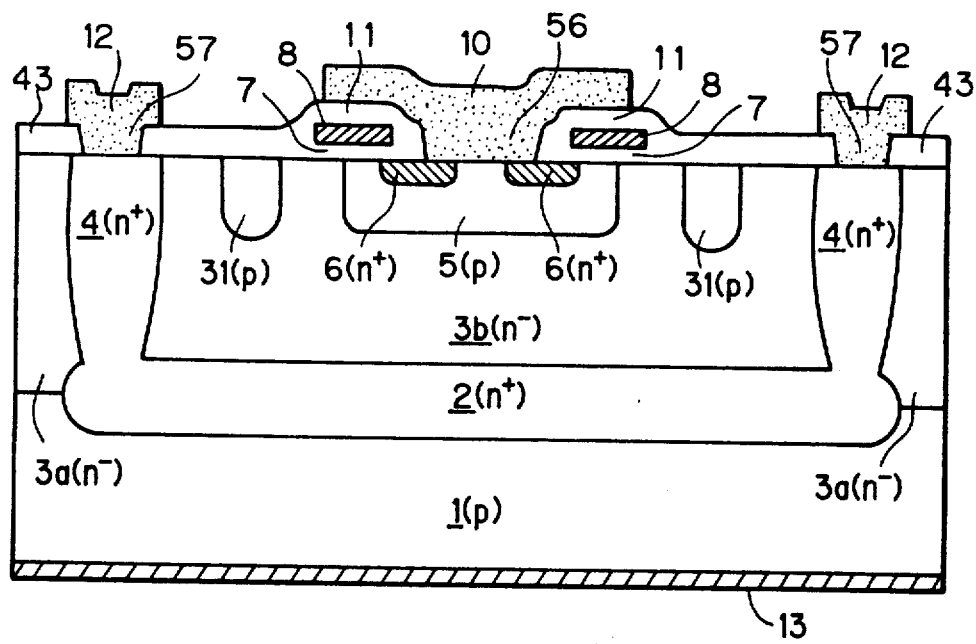
Figure 6A:
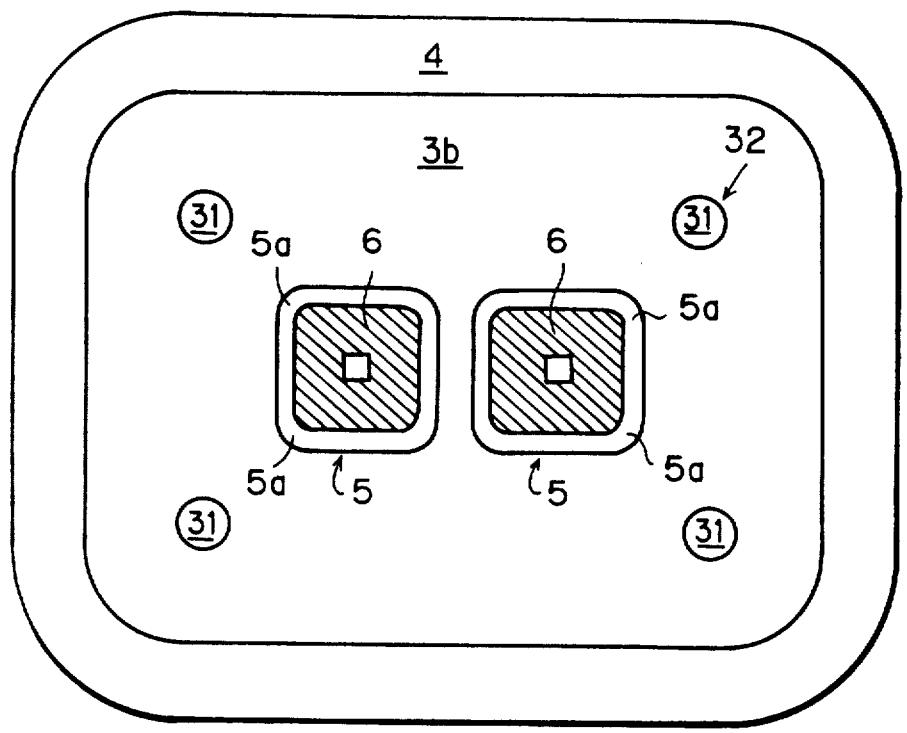
FIGS. 6A and 6B are plan views of the MOSFETs according to other preferred embodiments of the present invention.

Referring to FIGS. 6A to 5H, manufacturing processes of the MOSFET 200 are described hereinafter. First, a p-type silicon substrate 1 shown in FIG. 5A is prepared, and a pattern of a silicon oxide film 41 is formed on the top major surface thereof. N-type impurities are diffused at high concentration from a window of the oxide film 41 to the substrate 1 to obtain an n⁺-type layer 42.

Next, the oxide film 41 is removed, and an n⁻-type epitaxial layer 3 (in FIG. 5B) is formed on the top major surface of the substrate Impurities are diffused from the n⁺-type layer 42 of FIG. 6A to the n⁻-type epitaxial layer 3, thereby an n⁺-type buried layer 2 being formed. On the top surface of the epitaxial layer 3 is formed a pattern of a silicon oxide film 43. Through a window of the oxide film 43, n-type impurities at high concentration are diffused deeply into the epitaxial layer 3, thereby an n⁺-type drain region 4 being formed. The n⁺-type drain region 4 separates the n⁻-type epitaxial layer 3 into an n⁻-type layer 3b in the center and an n⁻-type layer 3a in the periphery. In FIGS. 5C to 5G referred to hereinafter, only the upper portion than the line C—C of FIG. 5B is shown.

In the step shown in FIG. 5C, the oxide film 43 is etched away in the center and instead a thin silicon oxide film 44 is formed. The oxide film 44 includes a portion to be used afterward as a gate oxide film. When the oxide film 44 is formed, a thin silicon oxide film 45 is also formed on the n⁺-type drain region 4.

By coating with resist material and patterning thereof, a resist layer 46 having a window 47 is formed as shown in FIG. 5D. Masked with the resist layer 46, p-type impurity ions such as boron are injected through the oxide film 44 into the n⁻-type layer 3b. After the removal of the resist layer 46, the p-type impurities are thermally diffused in the n⁻-type layer 3b. Through this step is formed a discrete array of the p-type semiconductor regions 31 in the vicinity of the top surface of the n⁻-type layer 3b. As is not shown in FIG. 5D, this discrete array is rectangular as shown in FIG. 1A and surrounds a rectangular zone. All of the p-type semiconductor regions 31 distribute in a plane substantially parallel to the top major surface of the semiconductor substrate 1 (in FIG. 5B).

In the next step shown in FIG. 5E, a polysilicon layer 48 is formed on the entire top surface. The polysilicon layer 48 is coated with resist material, which is then patterned, and thereby a resist pattern 49 is obtained. The resist pattern 49 is disposed above the zone surrounded by the array of the p-type semiconductor regions 31.

Masked with the resist patter 49, the polysilicon layer 48 is selectively etched, thereby a gate electrode 8 shown in FIG. 5F being obtained. The plane shape of the gate electrode 8 approximates to a rectangular ring, and there is a window 50 in the center thereof. The gate electrode 8 is electrically insulated from the n⁻-type layer 3b by the oxide film 43.

Next, a resist pattern 51 is formed so that each area except the window 50 is coated with resist material. P-type impurity ions such as boron are injected through the window 50 into the n⁻-type layer 3b to form a p-type region 52. After the removal of the resist patterns 49 and 51, ±he impurities in the p-type region 52 are thermally diffused to obtain a p-type semiconductor region 5 as a spacially extended region from the p-type region 52. The p-type semiconductor region 5 is opposite to the window 50 and a part of the gate electrode 8.

In the next step shown in FIG. 5G, by coating with resist material and patterning thereof, a resist layer 54 having a rectangular ring like window 55 is formed. The outer periphery of the window 55 is adjusted to the position of the window 50 of the gate electrode 8 shown in FIG. 5F. The oxide film 44 of FIG. 5F is patterned by means of the window 55, thereby a gate oxide film 7 and an oxide film 53 in the center being Obtained. Subsequently n-type impurity ions such as arsenic are injected through the window 55 into the p-type semiconductor region 5 to obtained an n⁺-type source region 6.

After this step, the resist layer 54 is removed, and a silicon oxide film is formed on the entire exposed surface Contact holes 56 and 57 are formed in this silicon oxide film, and thereby a part of this silicon oxide film on the gate electrode 8 is formed into a layer insulating film 11 of FIG. 5H. Subsequently by formation of an aluminium layer and patterning thereof, a source electrode 10 and a drain electrode 12 are obtained. The source electrode 10 is electrically in contact with both the n⁺-type source region 6 and the p-type semiconductor region 5 through the contact hole 56. The drain electrode 12 is electrically in contact with the n⁺-type drain region 4 through the contact hole 57. On the bottom major surface of the silicon substrate 1 is formed a back electrode 13 made of metal.

C. Other Preferred Embodiments

The plane distribution of the p-type semiconductor regions 31 may be other than the distribution shown in FIG. 1A. For example, a p-type semiconductor region group 32 shown in FIG. 6A has only four p-type semiconductor regions 31 facing to the corners 5a of a pair of p-type semiconductor regions 5. This is because a depletion layer extending into the n⁻-type semiconductor region 3b generates the largest electric field in the areas facing to these corners 5a.

Figure 6B:
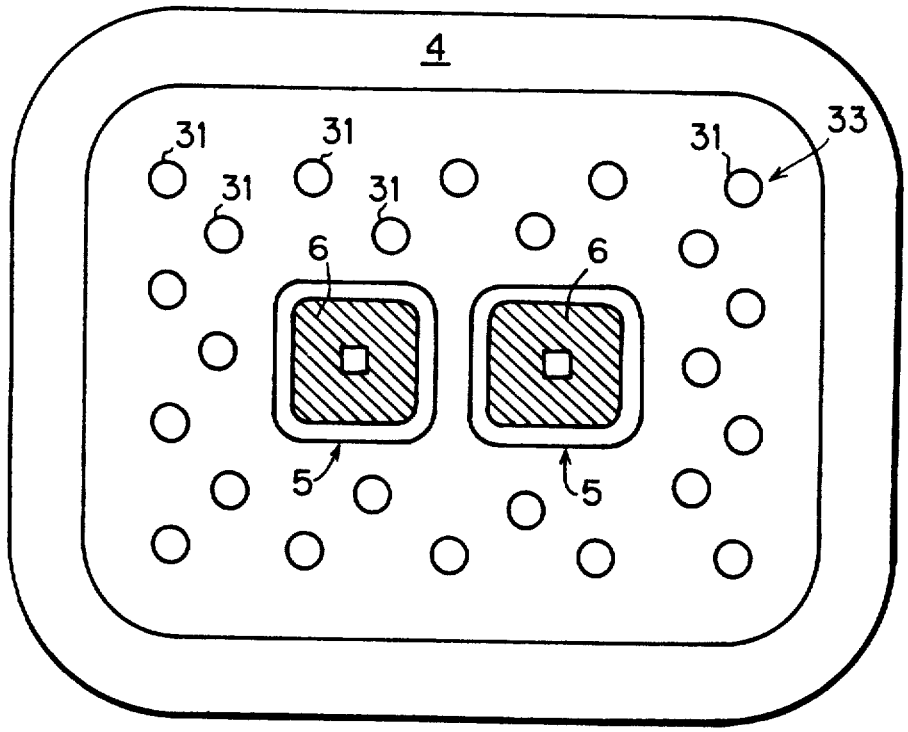

A p-type semiconductor region group 33 composed of two rectangular ring arrays of the p-type semiconductor regions 31 is shown in FIG. 6B. The regions 31 which belong to the inner rectangular ring array and the other regions 31 which belong to the outer rectangular ring array are disposed in staggered fashion. Hence, the extension width of the depletion layer is further increased.

Figure 7A:
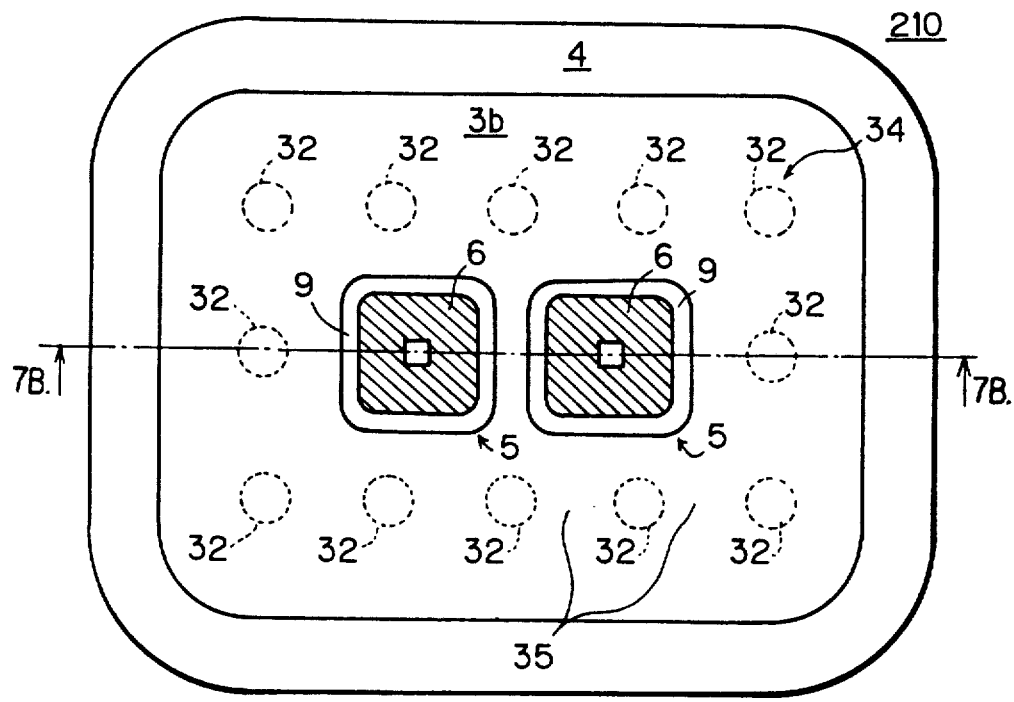
FIG. 7A is a plan view of the MOSFET according to still another preferred embodiment.
Figure 7B:
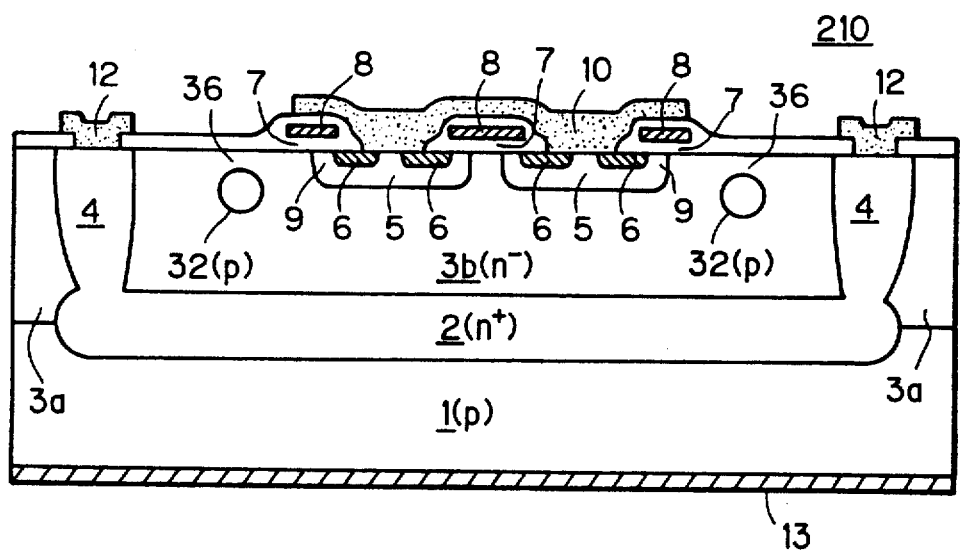
FIG. 7B is a cross-sectional view of the MOSFET taken along the line A4—A4 of FIG. 7A.

In a MOSFET 210 shown in FIG. 7A, a semiconductor region group 34 comprising an array of p-type buried semiconductor regions 32 is formed in the n⁻-type layer 3b. As shown in FIG. 7B which is a cross-sectional view taken along the line A4—A4 of FIG. 7A, the burying depth of the regions 32 is substantially equal to the depth of the bottom of the p type semiconductor regions 5. In the case where such burying structure is adopted, an advantage is that not only regions 35 (in FIG. 7A) between the respective p-type regions 32 but also regions 36 (in FIG. 7B) between the p-type regions 32 and the gate insulating film 7 are ensured as current paths between the channel forming regions 9 and the n⁺-type drain region 4 in the conduction state.

Figure 8B:
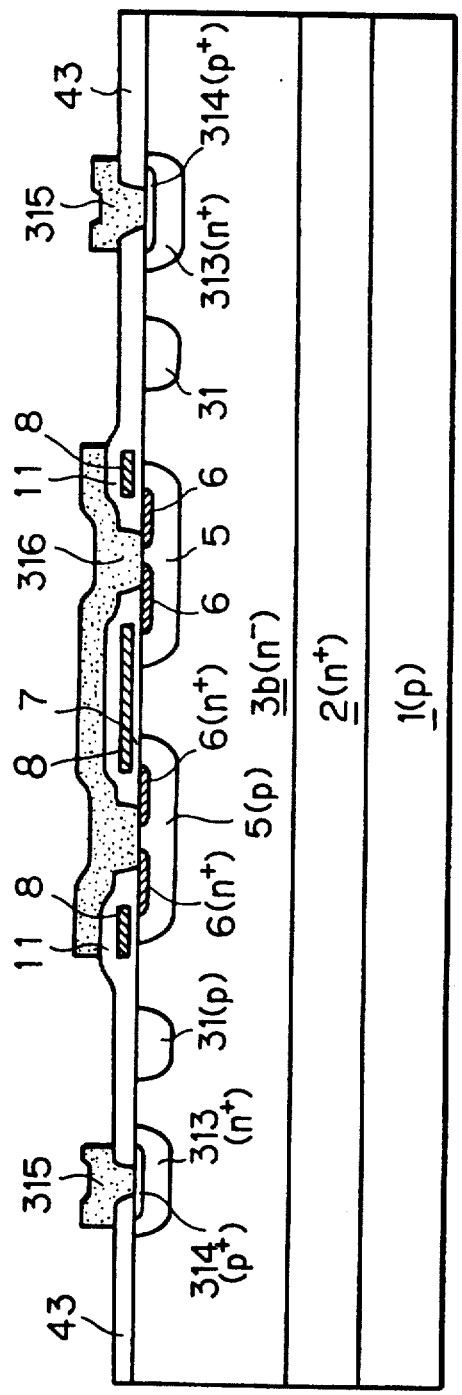
FIG. 8B is a cross-sectional view of the IGBT taken along the line A5—A5 of FIG. 8A.
Figure 8A:
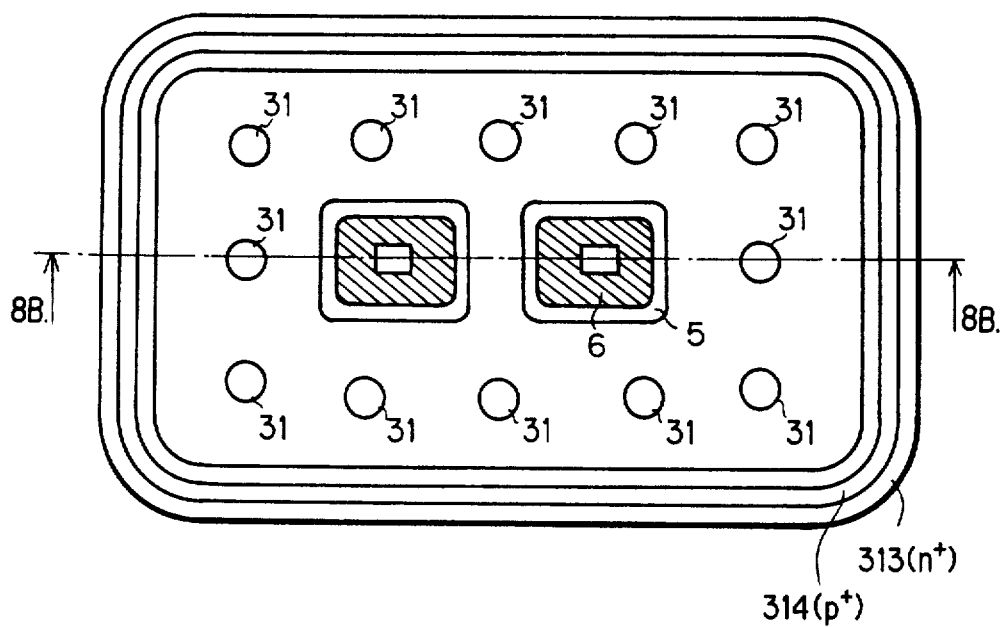
FIG. 8A is a plan view of an IGBT to which a preferred embodiment of the present invention is applied.

FIG. 8A is a partial plan view showing an example applying the present invention to an IGBT (Insulated Gate Bipolar Transistor), and FIG. 8B is a cross-sectional view taken along the line A5—A5 of FIG. 8A. A plan view taken on the plane A6—A6 of FIG. 8B corresponds to FIG. 8A. In an IGBT 300, an electrode 316 which is in contact with the p-type semiconductor layers 5 and the n⁺-type semiconductor layers 6 is an emitter electrode. In the top surface portion of the n⁻-type layer 3b, there are provided a ring-like n⁺-type semiconductor layer 313 and a ring-like p+-type semiconductor layer 314 formed selectively therein. A collector electrode 315 is electrically in contact with the p+-type semiconductor layer 314 through a contact hole between the oxide films and 43. The IGBT 300 is also provided with a p-type semiconductor region group 37 composed of a discrete array of the p-type semiconductor regions 31 in the top surface portion of the n⁻-type layer 3b which surrounds the n⁺-type regions 6. The p-type semiconductor regions 31 are disposed between the n⁺-type regions 6 and the n⁺-type semiconductor layer 313. Hence, the anti-breakdown ability can be improved just like the MOSFET 200. The present invention is applicable to both a unipolar field effect semiconductor device and a bipolar field effect semiconductor device.

Figure 9:
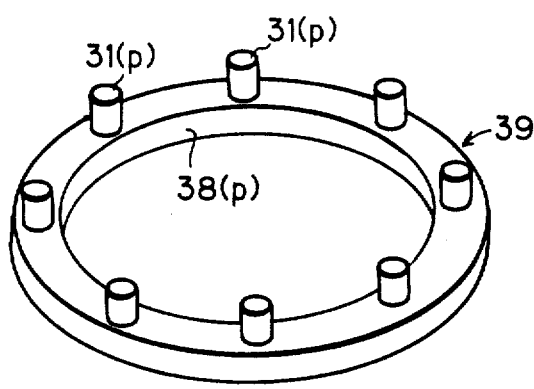
FIG. 9 shows a modification of a semiconductor region group.

Either in the MOSFET or in the IGBT, the p-type semiconductor regions 31 in an array may be connected to each other. In a semiconductor region group 39 of FIG. 9, the p-type semiconductor regions 31 in the array are connected to each other by a ring-like p-type semiconductor buried region 38. As far as there are spaces between the p-type semiconductor regions 31 adjacent to each other, the current path in the conduction state can be ensured.

Although the present invention has been described and illustrated in detail, it is clearly understood that the same is by way of illustration and example only and is not to be taken by way of limitation. The spirit and scope of the present invention should be limited only by the terms of the appended claims.

We claim:

1. A field effect semiconductor device comprising:
   (a) a first conductivity type semiconductor layer formed on a major surface of a second conductivity type semiconductor substrate;
   (b) a second conductivity type first semiconductor region formed selectively in a surface portion of said semiconductor layer;
   (c) a first conductivity type second semiconductor region formed selectively in a surface portion of said first semiconductor region;
   (d) an insulating film formed on a first area of an exposed surface of said first semiconductor region;
   (e) a control electrode formed on said insulating film;
   (f) a first main electrode formed to cover a second area of said exposed surface of said first semiconductor region and an exposed surface of said second semiconductor region, wherein said second area is separated from said first area across said exposed surface of said second semiconductor region;
   (g) a second main electrode formed on a predetermined position of an exposed surface of said semiconductor layer distant from said first semiconductor region; and
   (h) a second conductivity type semiconductor region group formed selectively in a portion of said semiconductor layer between said first semiconductor region and said second main electrode.

2. The field effect semiconductor device of claim 1, wherein
said semiconductor region group comprises:
a first array of second conductivity type third semiconductor regions surrounding said first semiconductor region.

3. The field effect semiconductor device of claim 2, wherein
said first semiconductor region is shaped into a rectangle in a plane parallel to said major surface; and
said first array of said third semiconductor regions comprises:
second conductivity type fourth semiconductor regions located at positions in said semiconductor layer facing to corners of said rectangle.

4. The field effect semiconductor device of claim 3, wherein
said first array of said third semiconductor regions further comprises:
second conductivity type fifth semiconductor regions located at positions in said semiconductor layer defined between said fourth semiconductor regions.

5. The field effect semiconductor device of claim 4, wherein
said semiconductor region group further comprises:
a second array of second conductivity type sixth semiconductor regions which surrounds said first semiconductor region and is surrounded by said first array of said third semiconductor regions.

6. The field effect semiconductor device of claim 5, wherein
said third semiconductor regions and said sixth semiconductor regions are alternately arranged into a staggered array in said plane.

7. The field effect semiconductor device of claim 2, wherein
said first array of said third semiconductor regions is a discrete array in said plane.

8. The field effect semiconductor device of claim 7, wherein
each of said third semiconductor regions has a bottom in said semiconductor layer and depth of said bottom is substantially equal to a bottom depth of said first semiconductor region in said semiconductor layer.

9. The field effect semiconductor device of claim 8, wherein
each of said third semiconductor regions is exposed to said exposed surface of said semiconductor layer.

10. The field effect semiconductor device of claim 9, wherein
said semiconductor region group further comprises:
a second conductivity type semiconductor ring region provided in said semiconductor layer and connecting said third semiconductor regions with each other.

11. A field effect semiconductor device comprising:
   (a) a first conductivity type semiconductor layer formed on a major surface of a second conductivity type semiconductor substrate;
   (b) a second conductivity type first semiconductor region formed selectively in a surface portion of said semiconductor layer;
   (c) a first conductivity type second semiconductor region formed selectively in a surface portion of said first semiconductor region;
   (d) an insulating film formed on a first area of an exposed surface of said first semiconductor region;
   (e) a control electrode formed on said insulating film;
   (f) a first main electrode formed to cover a second area of said exposed surface of said first semiconductor region and an exposed surface of said second semiconductor region, wherein said second area is separated from said first area across said exposed surface of said second semiconductor region;
   (g) a second conductivity type third semiconductor region formed in a surface portion of said semiconductor layer distant from said first semiconductor region;
   (h) a second main electrode formed on said third semiconductor region; and
   (i) a second conductivity type semiconductor region group formed selectively in a portion of said semiconductor layer between said first semiconductor region and said second main electrode.

12. The field effect semiconductor device of claim 11, wherein
said semiconductor region group comprises:
an array of second conductivity type fourth semiconductor regions surrounding said first semiconductor region.

13. The field effect semiconductor device of claim 12, wherein
said first semiconductor region is shaped into a rectangle in a plane parallel to said major surface; and
said array of said fourth semiconductor regions comprises:
second conductivity type fifth semiconductor regions located at positions in said semiconductor layer facing to corners of said rectangle.

14. The field effect semiconductor device of claim 13, wherein said array of said fourth semiconductor regions further comprises:
second conductivity type sixth semiconductor regions located at positions in said semiconductor layer defined between said fifth semiconductor regions.

15. The field effect semiconductor device of claim 12, wherein
said array of said fourth semiconductor regions is a discrete array in said plane.

16. The field effect semiconductor device of claim 15, wherein
each of said fourth semiconductor regions has a bottom in said semiconductor layer and depth of said bottom is substantially equal to a bottom depth of said first semiconductor region in said semiconductor layer.

17. The field effect semiconductor device of claim 16, wherein
each of said fourth semiconductor regions is exposed to an exposed surface of said semiconductor layer.

* * * * *